United States Patent
Arnold et al.

(10) Patent No.: US 7,640,469 B2
(45) Date of Patent: Dec. 29, 2009

(54) ELECTRONIC ELEMENT COMPRISING AN ELECTRONIC CIRCUIT WHICH IS TO BE TESTED AND TEST SYSTEM ARRANGEMENT WHICH IS USED TO TEST THE ELECTRONIC ELEMENT

(75) Inventors: Ralf Arnold, Poing (DE); Peter Ossimitz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/347,824

(22) Filed: Feb. 3, 2006

(65) Prior Publication Data

US 2006/0190792 A1 Aug. 24, 2006

Related U.S. Application Data

(63) Continuation of application No. PCT/DE2004/001493, filed on Jul. 8, 2004.

(30) Foreign Application Priority Data

Aug. 5, 2003 (DE) ................. 103 35 809

(51) Int. Cl.
*G01R 31/28* (2006.01)
*G11C 29/00* (2006.01)
*G01R 31/26* (2006.01)

(52) U.S. Cl. .................. 714/724; 365/201; 324/765
(58) Field of Classification Search .............. None
See application file for complete search history.

(56) References Cited

U.S. PATENT DOCUMENTS 5,056,094 A * 10/1991 Whetsel .................. 714/736
5,132,635 A * 7/1992 Kennedy ................. 324/763
5,146,161 A * 9/1992 Kiser .................... 324/763
5,175,494 A * 12/1992 Yoshimori ............... 714/728

(Continued)

FOREIGN PATENT DOCUMENTS

DE 195 36 226 A1 4/1997

(Continued)

OTHER PUBLICATIONS

International Search Report from corresponding International Application No. PCT/DE2004/001493.

(Continued)

*Primary Examiner*—Kevin L Ellis
*Assistant Examiner*—Guerrier Merant
(74) *Attorney, Agent, or Firm*—Brinks Hofer Gilson & Lione

(57) ABSTRACT

An electronic element, test system and method of testing an electronic circuit are provided. The electronic circuit has input and output terminals. The input terminals receive a test signal sequence to test the electronic circuit. Actual value signals of a 3-value logic of the electronic circuit are provided at the output terminals in response to the test signal sequence. A comparator circuit has first and second input terminals and an output terminal. Each of the output terminals of the electronic circuit are coupled to a first input terminal. The second input terminals receive desired value signals. The comparator circuit compares the actual value signals with the desired value signals and provides the comparison to the output terminal of the comparator circuit.

21 Claims, 7 Drawing Sheets

U.S. PATENT DOCUMENTS

| | | | |
|---|---|---|---|
| 5,737,342 A * | 4/1998 | Ziperovich | 714/736 |
| 5,809,040 A | 9/1998 | Dallmann et al. | |
| 6,543,018 B1 | 4/2003 | Adusumilli et al. | |
| 6,934,900 B1 * | 8/2005 | Cheng et al. | 714/738 |
| 6,961,882 B2 * | 11/2005 | Manfred et al. | 714/718 |
| 6,972,598 B2 * | 12/2005 | Yoo | 326/95 |
| 7,043,674 B2 * | 5/2006 | Rearick et al. | 714/724 |
| 7,047,461 B2 * | 5/2006 | Yamazaki et al. | 714/719 |
| 7,099,783 B2 * | 8/2006 | Hasegawa et al. | 702/57 |
| 7,171,595 B1 * | 1/2007 | Huse et al. | 714/718 |
| 2002/0021140 A1 | 2/2002 | Whetsel | |
| 2003/0061554 A1 * | 3/2003 | Manfred et al. | 714/718 |
| 2003/0067314 A1 | 4/2003 | Kaukko | |
| 2005/0050408 A1 * | 3/2005 | Kaginele | 714/718 |
| 2005/0154947 A1 * | 7/2005 | Taniguchi | 714/726 |
| 2007/0136630 A1 * | 6/2007 | Whetsel | 714/736 |

FOREIGN PATENT DOCUMENTS

| | | |
|---|---|---|
| EP | 0 780 767 A2 | 6/1997 |
| WO | WO 01/59466 A1 | 8/2001 |
| WO | WO 03/093843 A1 | 11/2003 |

OTHER PUBLICATIONS

Preliminary Examination Report from corresponding International Application No. PCT/DE2004/001493.

Dr. Ing, Ulrich Tietze and Dr. Ing. Christoph Schenk, Semi-Conductor Circuitry, Eighth revised Edition, Springer Publishing Company, 9.4 "Circuit Engineering Implementation of the Basic Functions" (p. 207).

Manfred Gerner et al., "Self Test Digital Circuits", Library of the German Patent Office, Dec. 7, 1990, 2. Fundamentals of Self Test Architectures (pp. 56-124).

International Search Report from corresponding International Application No. PCT/DE2004/001493, Feb. 3, 2006.

Preliminary Examination Report from corresponding International Application No. PCT/DE2004/001493, Feb. 3, 2006.

* cited by examiner

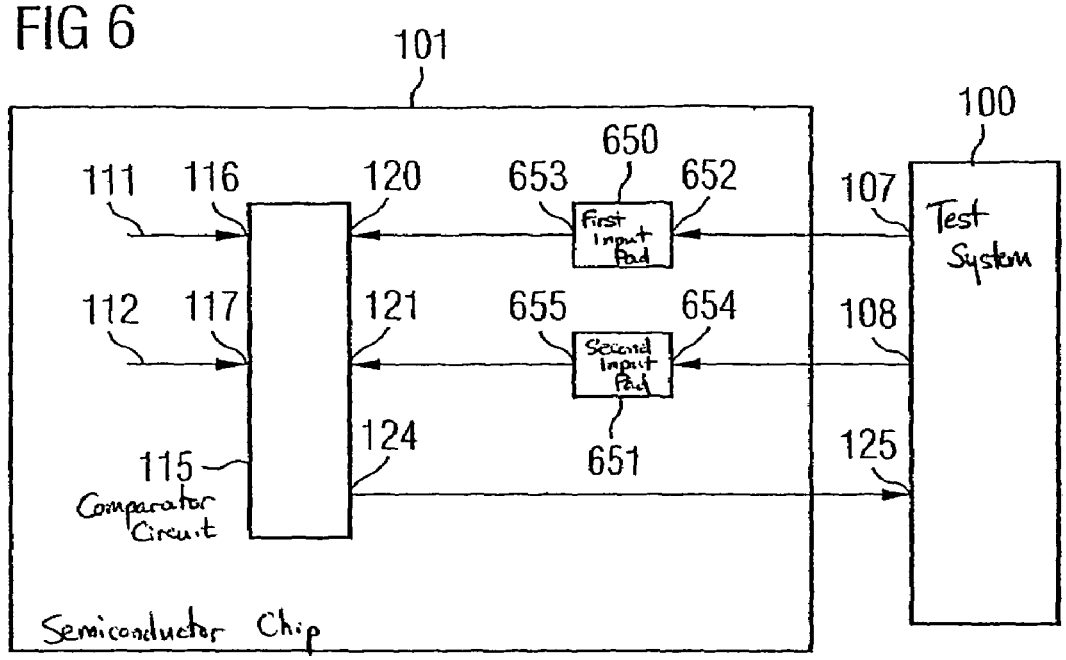
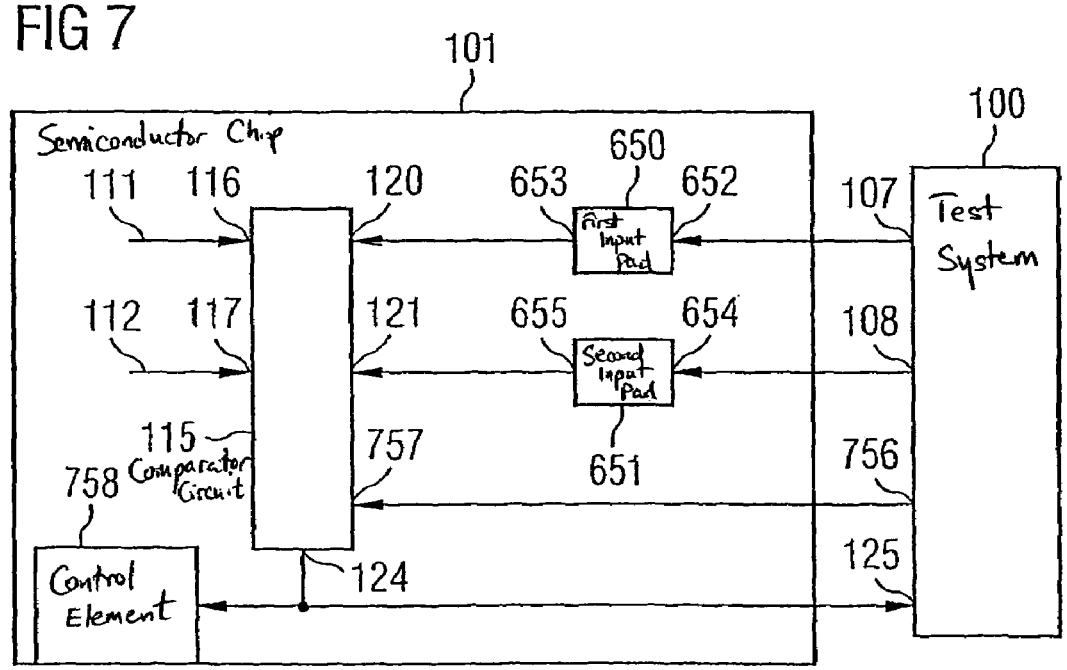

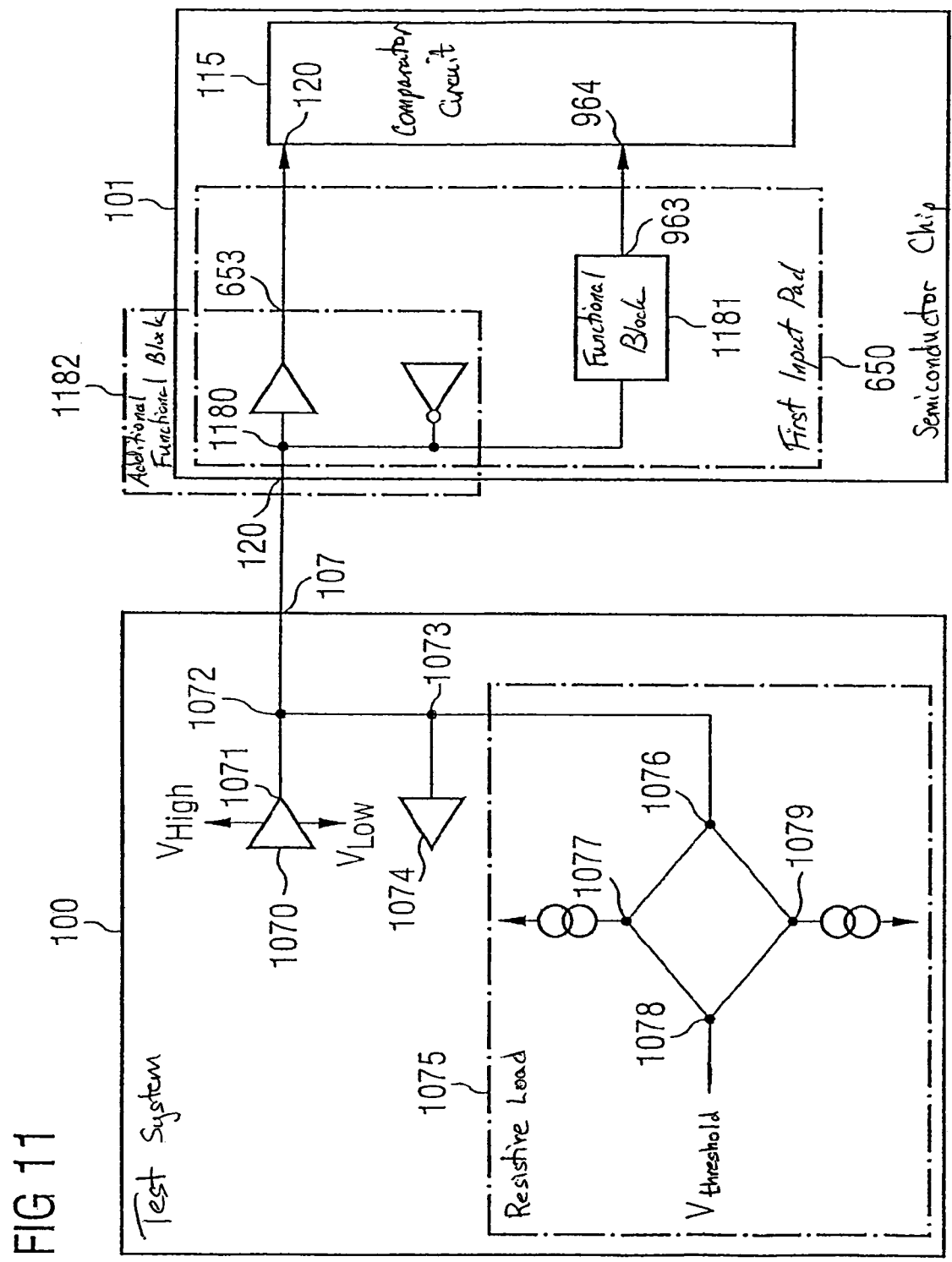

ELECTRONIC ELEMENT COMPRISING AN ELECTRONIC CIRCUIT WHICH IS TO BE TESTED AND TEST SYSTEM ARRANGEMENT WHICH IS USED TO TEST THE ELECTRONIC ELEMENT

PRIORITY CLAIM

This application is a continuation of international application PCT/DE2004/001493, filed on Jul. 8, 2004, which claims priority to German Patent Application DE 103 35 809.9, filed on Aug. 5, 2003, both of which are incorporated by reference in their entirety.

TECHNICAL FIELD

The present invention relates to an electronic element. More specifically, the present invention relates to an electronic element comprising an electronic circuit which is to be tested and a test system arrangement which is used to test the electronic element.

BACKGROUND

In the production of large scale integrated semiconductor chips, the ever increasing miniaturization of the structures on the semiconductor chip means that ever more exacting requirements are made of the fabrication installations and production processes used for the production of the semiconductor chips. The stability and reproducibility both of the fabrication installations and of the production processes influence the yield and productivity in the context of semiconductor chip fabrication. Even small deviations from a desired behavior of a chip fabrication installation in the context of production may lead to a considerable impairment of the yield, that is to say to a considerable increase in the defect rate for the semiconductor chips produced.

In order to ensure the quality of the semiconductor chips and to establish possible defects in a semiconductor chip, all the processed semiconductor chips have to be subjected to tests. Use has hitherto been made of functional tests, inter alia, which operate the semiconductor chip in a manner similar to the application and thus test it for fabrication defects. Since semiconductor chips comprise many individual electronic components, the individual electronic components are difficult to test by driving each individual electronic component separately with a test signal externally, since this would require far too many terminals on the chip.

In order to solve this problem, a scan test was introduced. During the scan test, all the components, that is to say digital gates, of all the chips produced are tested. To test the gates, a set of the storing components of a chip (flip-flops) are coupled to form a scan chain. In a scan chain, the individual flip-flops of the scan chain are connected in series with one another, one input terminal and one output terminal being available for the entire scan chain, by means of which the scan chain can be driven and read externally. During a first phase of the scan test, a shift phase, a test signal sequence is applied to the input terminal of the scan chain by means of a test system, a test signal sequence being shifted through the scan chain in clocked fashion. Overall, the number of clock cycles of the shift phase is equal in magnitude to the number of storing components (flip-flops) in the scan chain. After the end of the shift phase, a test signal is thus available at each storing component of the scan chain.

In a second phase of the scan test, the chip to be tested is operated in a normal mode for at least one clock cycle. In the normal mode, the chip is operated in accordance with its function. In this case, by means of the test signal provided at the respective storing components of the scan chain, a respective partial actual value signal is generated at a respective functional input of a storing component of the scan chain, the partial actual value signals of all the storing components of the scan chain forming an actual value signal.

During a third phase of the scan test, the output signals of the elements (the storing components of the scan chain) are shifted through the scan chain in clocked fashion and read out at the output terminal of the scan chain. The third phase of the scan test again has exactly the same number of clock cycles as the number of storing components in the scan chain.

After the end of such a cycle comprising the three phases described above, the actual value signal read out at the output terminal of the scan chain can be fed back to the test system. The test system had previously stored the signals of the test signal sequence, that is to say the input data (stimuli) which were applied to the storing components of the scan chain, and the associated desired value signal determined, that is to say the output data (expected responses) representing the reaction of the electronic components (digital gates) to be tested to the signals of the test signal sequence. Furthermore, the test system compares the actual value signal with a desired value signal to establish possibly defective electronic components of the semiconductor chip.

Consequently, by means of the standard scan test described above a large number of electronic components (digital gates) of a semiconductor chip can be tested with just one input terminal and one output terminal per scan chain. Known methods in the functional or scan based test proceed from generation, redistribution and decompression of input data situated on the electrical circuit.

DE 195 36 226 discloses a circuit arrangement with identical circuit blocks connected to one another in an arbitrary manner. In addition, the circuit arrangement has at least one input and one output terminal, in which, by means of a controlled switching device, the individual circuit blocks can be released from the connection to one another, can be coupled on the input side to a common input terminal for feeding in an input test pattern, and can be connected on the output side to an evaluation device for comparing the output test patterns of the individual circuit blocks.

It is known from "Halbleiter-Schaltungstechnik" ["Semiconductor circuitry"]; U. Tietze and Ch. Schenk; 8$^{th}$ Revised Edition; Springer Verlag Berlin (1986), pages 207-208 that gates can have a Tristate output.

"Selbsttest digitaler Schaltungen" ["Self-test of digital circuits"]; M. Gerner et al.; Oldenbourg Verlag Munich Vienna (1990), pages 56 to 59, pages 74 to 82 and pages 120 to 124 discloses a self-test principle, a boundary scan principle and a test response evaluation.

WO 01/59466 discloses a test arrangement and a test method, the test arrangement having a coupling which is to be tested and which has one or more analog components.

FIG. 5 schematically illustrates a test system 500 having a semiconductor chip 501 to be tested in the standard scan test. The test system 500 has a vector memory 502, output terminals 503 and input terminals 504. Four scan chains 505 are illustrated schematically on the semiconductor chip 501. Each the scan chains has an input terminal 506 and an output terminal 507. During the standard scan test, each output terminal 503 of the test system 500 is coupled to an input terminal 506 of the scan chains 505 of the semiconductor chip 501 and during the standard scan test, each output terminal 507 of the scan chains 505 of the semiconductor chip 501 is coupled to an input terminal 504 of the test system 500.

If, by means of the output terminals 503 of the test system 500, test signals are fed to the input terminals 506 of the scan chains 505 of the semiconductor chip 501 during the first shift phase of the scan test, the semiconductor chip 501 generates partial actual value signals during the subsequent normal phase. These signals together form the actual value signal. The partial actual value signals are then compared in the second shift phase by means of the output terminals 507 of the scan chains 505 of the semiconductor chip 501 in the input terminals 504 of the test system 500 with the previously stored determined desired value signal (expected responses) from the vector memory 502 in the test system 500. Both the signals of the test signal sequence and the desired value signal of the semiconductor chip 501 were stored in the vector memory 502. Information about the difference between desired value signal and actual value signal is stored in the test system 500 for analysis. The analysis is carried out by means of the test system 500.

One problem that arises in the case of the scan test in accordance with the prior art is that the test system can only react slowly in the case of an error. An error may be if the comparison with the expected responses from the vector memory 502 reveals that an actual value signal does not match the corresponding desired value signal. This is caused by signal propagation times between the semiconductor chip 501 and the test system 500, called the round trip delay.

In addition, a test system pipeline of the vector memory is first completely processed before the test system 500 can establish whether an error has occurred and can react thereto. The fastest possible reaction is desired, however, in order that all the data which are used for an error analysis are also available as soon as it is determined that an error has occurred. In other words, it is desirable to avoid the situation in which the storing components of the semiconductor chip 501 undergo transition to a different state compared with the state that represents an error in the respective electronic component. This cannot be ensured by means of the above-described test system 500 in accordance with the prior art since, in the time interval between the generation of the partial actual signal representing an error and the establishment of an error and reaction by the test system 500, the storing components have already changed their states.

BRIEF DESCRIPTION OF THE DRAWINGS

The present invention is illustrated by way of example and not limited to the accompanying figures in which like references indicate similar elements. Exemplary embodiments will be explained in the following text with reference to the attached drawings, in which:

FIG. 6 shows a second schematic illustration of the test system according to the invention as shown in FIG. 1 with an electronic element in accordance with one exemplary embodiment of the invention;

FIG. 7 shows a schematic illustration of a test system arrangement according to the invention in which an additional terminal pin is formed for providing a signal for masking actual value signals having an undefined state;

FIG. 11 shows a schematic illustration of a test system arrangement in accordance with the additional aspect of the invention.

Figure 1:
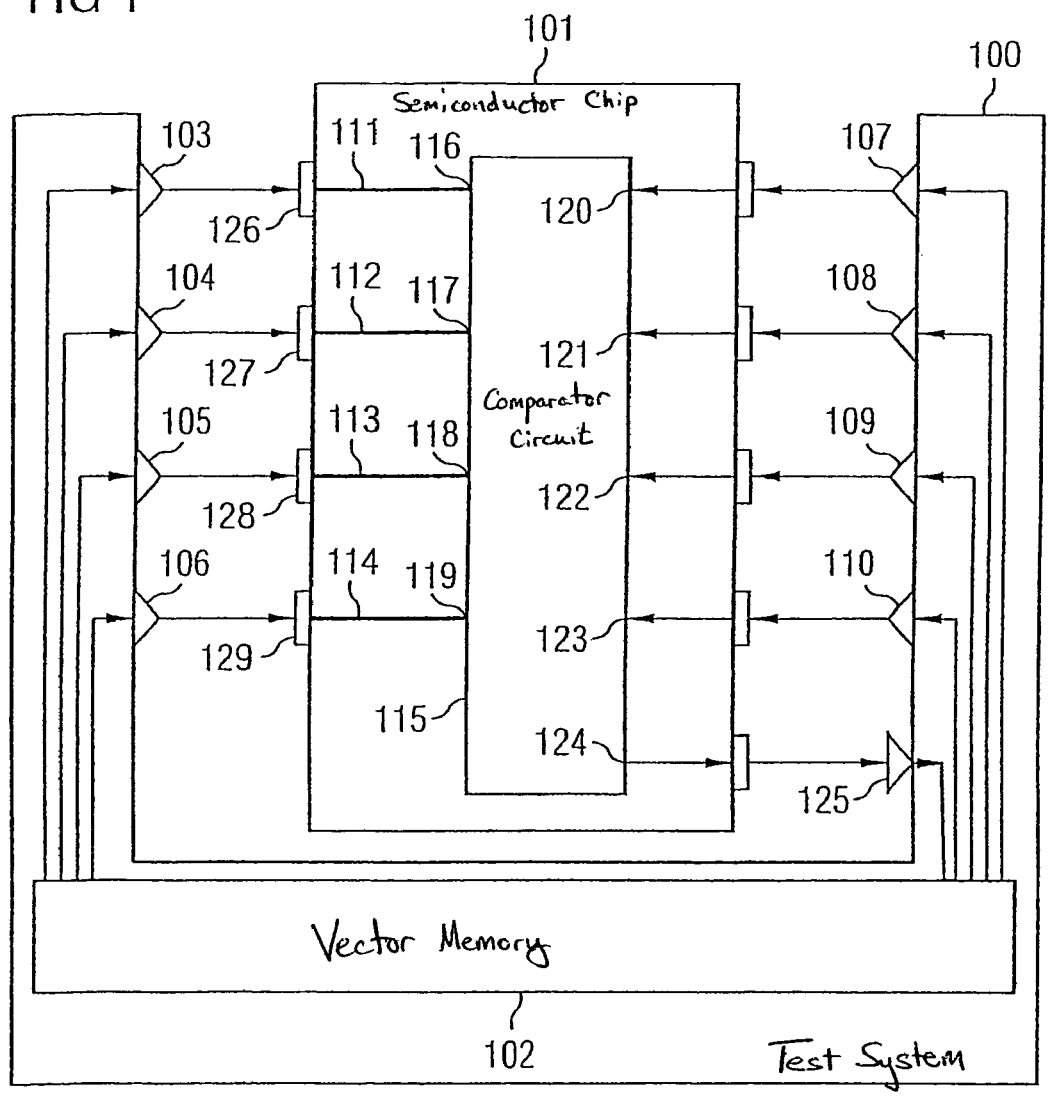
FIG. 1 shows a schematic illustration of a test system according to the invention with an electronic element in accordance with one exemplary embodiment of the invention.

Skilled artisans appreciate that elements in the figures are illustrated for simplicity and clarity and have not necessarily been drawn to scale.

DETAILED DESCRIPTION

An electronic element, a test system, and method for testing the electronic element in a time- and cost-saving fashion and method thereof are presented. The electronic circuit to be tested has input terminals that receive a test signal sequence to test the electronic circuit, and output terminals. Actual value signals of the electronic circuit to be tested are provided at the output terminals in response to the test signal sequence. The electronic element also has at least one comparator circuit. The comparator circuit has first input terminals. Each of the output terminals of the electronic circuit to be tested are coupled to one of the first input terminals. The comparator circuit has second input terminals for feeding in desired value signals and at least one output terminal. The comparator circuit is set up such that it compares the actual value signals with the desired value signals. The results of the comparison can be provided at the output terminal(s) of the comparator circuit.

The test system contains a vector memory and the electronic element. The test system has test output terminals coupled to the input terminals of the electronic circuit to be tested, and second output terminals coupled to the second input terminals of the comparator circuit. In addition, the test system has at least one input terminal. For each of the output terminals of the comparator circuit, an input terminal of the test system is provided which is coupled to the corresponding output terminal of the comparator circuit.

Since the comparison between actual value signals and desired value signals is carried out directly on the electronic element, signal propagation times between the electronic circuit and the test system, the round trip delays, are obviated as are the times for processing the test system pipeline. As a result of this, the time duration used for a test is shortened, which this makes it possible to "freeze" the electronic state in the error state. Furthermore, as few as one output terminal may be used for the electronic element since the comparison takes place in the comparator circuit on the electronic element. As a result, practically all the terminals of the electronic circuit are available as input terminals, which increases the possibilities for parallelization of the tests of the electronic circuit.

The electronic circuit may be set up such that a number of events can occur. An arbitrary variation of a scan test signal sequence can be used as the test signal sequence. A functional test can be carried out, i.e. an arbitrary functional test for the functional checking of the circuit. In addition, an analog test with digital output can be carried out, i.e. a test of an analog stage which supplies digital actual value signals. A scan test may be used as a test for possible defects of a semiconductor chip since many individual electronic components are tested which cannot all be driven externally with test signals. The comparator circuit may be set up such that it can process signals of a 2-value (binary) logic.

A clocked test signal sequence may have a signal pattern that is predetermined such that each partial actual value signal characterizes a defined state of a storing component and, consequently, each actual value signal characterizes a defined state of a tested electronic circuit. A 2-value logic can be used without an actual value signal of an undefined state of one or more storing components of the electronic circuit being generated during the comparison. When using compression of signals, it may otherwise happen that upon the occurrence of an undefined state of an individual storing component, all information at the other storing components contributing to the testing of defects, and thus to increasing the test coverage, are ignored.

The electronic element may have a control element set up such that depending on the result of the comparison, the electronic element can hold unchanged a state of the electronic circuit to be tested. Holding the state of one or more storing components or of the entire tested electronic circuit unchanged is realized in one embodiment by means of a clock generator. The clock generator may be integrated on the semiconductor chip and coupled to the control element. The clock generator may be stopped by means of a stop signal, which is generated by the control element and is fed to the clock generator. In this case, the clock generator may be stopped and, consequently, no longer generates clock signals, at least not for the storing components which are currently being tested by means of the test system. In other words, the clock signal from the clock generator is stopped by means of the control element and, as a result, the state of the individual respective storing components (possibly all the tested storing components of the tested electronic circuit) is "frozen".

The electronic element may have an electronic circuit to be tested which has input terminals for feeding in a test signal sequence used for testing the electronic circuit, and output terminals, actual value signals of the electronic circuit to be tested are provided at the output terminals in response to the test signal sequence. The electronic element may also have at least one comparator circuit. The comparator circuit has first input terminals, each of the output terminals of the electronic circuit to be tested being coupled to one of the first input terminals. The comparator circuit has second input terminals that receive desired value signals and at least one output terminal. The comparator is set up such that it compares the actual value signals with the desired value signals. Furthermore, the electronic element is set up such that it processes signals of a 3-value logic. The results of the comparison can be provided at the output terminal of the comparator circuit.

The test system has a vector memory and the above electronic element. The test system also has first output terminals coupled to the input terminals of the electronic circuit to be tested, and second output terminals coupled to the second input terminals of the comparator circuit. In addition, the test system has at least one input terminal, for each of the output terminals of the comparator circuit an input terminal of the test system being provided which is coupled to the corresponding output terminal of the comparator circuit. It is thus possible to mask undefined actual value signals occurring during the test by the interpretation of a signal of a 3-value logic without reducing the test coverage or having to provide additional terminal pins at the electronic element. The number of electronic elements that can be tested in parallel is thereby increased compared with the 2-value logic. Furthermore, the items of control information to be stored on the test system are not increased, i.e. an increase in the memory of the test system may be avoided.

With the use of a 2-value logic there are primarily two possibilities for masking undefined actual value signals. The first possibility is for all the actual value signals which are present at the first input terminals of the comparator circuit to be masked simultaneously by means of a common masking signal if an undefined state is present at a first input terminal of the comparator circuit. This leads to a reduction of the test coverage since the actual value signals which have a defined state are also masked out. When this first possibility is used, only one additional terminal pin is used at the electronic element. The second possibility is to mask only the actual value signals which have an undefined state at the comparator circuit. This leads to an increase in the test coverage, but uses for each first input terminal, i.e. each scan chain, an associated additional terminal pin at the electronic element via which it is possible to provide an individual masking signal for each individual scan chain. Furthermore, in this case double the number of items of control information are also used in the memory.

One of the logic levels of the 3-value logic may be formed as a masking logic level, which is used to mask undefined states of the actual value signals that occur in the comparator circuit. The second input terminals may be formed as input pads during the test, the input pads each having a functional block which is set up such that it processes the signal of the masking logic level. It is thereby possible to minimize the number of second input terminals used at the electronic element. The functional blocks of the individual input pads form the interpretation of the masking (third) logic level. Use of more than one second input terminal of the electronic element per scan chain may be avoided. The comparator circuit may have third input terminals which are each coupled to the functional blocks.

The electronic element may be set up such that two signals of the 2-value logic can be generated from one signal of the 3-value logic by means of the electronic element. The test system may be set up such that it generates signals of a 3-value logic which can be tapped off at the second output terminals. The test system may have a resistive load which can be used for forming one of the logic levels.

Thus, a scan test on electronic circuits can be carried out more simply, more rapidly and more cost-effectively. The electronic circuit has a comparator circuit, so that a comparison between partial actual value signals of storing components and partial desired value signals can be carried out directly by means of said comparator circuit on the semiconductor chip. This reduces the quantity of data to be transferred from the semiconductor chip to the test system. The results of the comparison are also available directly on the semiconductor chip. The actual value signals do not first have to be shifted through a pipeline of a vector memory of the test system. Thus, during the shift phase, which serves for the read-out, of the scan test, this shift phase can be stopped and the state of the system, that is to say of the storing components of the electronic circuit, can be frozen if an error in one or more storage components is detected during the comparison. By means of a feedback of the output of the comparator circuit to a control element that is integrated on the semiconductor chip, it is possible to form, besides the freezing of the state of one or more storing components, an additional read-out of actual value signals which have not yet been compared and/or compressed by means of the comparator circuit. As a result of this, all the data which are used for the diagnosis of the error are still available. The error diagnosis is thus simplified or actually made possible in an expedient manner in the first place. In a scan test in accordance with the prior art, the comparison is not carried out until so late that it is no longer possible to freeze the system in the state that caused the error detected. The values used for the error diagnosis are lost. Consequently, an error diagnosis is more difficult.

The test may be an arbitrary functional test for functional checking of the circuit, a test of an analog circuit which supplies digital actual value signals (mixed signal test), or an arbitrary variation of the scan test. A method for intensified parallelization of a test is thus achieved. By means of the method, input data can be utilized better and/or multiplied, whereby the parallelization of the test can be improved. In comparison, a one-to-one assignment of test system terminals to inputs/outputs of blocks of the electronic circuit to be tested is provided as in the standard scan test.

A 3-value logic for data communication may be used, i.e. the communication of desired value signals between a test system and an electronic circuit to be tested. The test system can generate signals from the 3-value logic, which clearly corresponds to 3-value information, without additional outlay on test channels (input terminals of the electronic element or output terminals of the test system), and can operate the electronic element therewith. Already existing input pads are extended by one functional block for the interpretation of the third logic level. This third logic level can then be used for masking undefined states of the actual value signals at the comparator circuit. In this case, the functional block of the input pad is set up such that it can generate two signals of a 2-value logic from one signal of a 3-value logic, it being possible for a signal of the 2-value logic to be used as a masking signal. This enables the electronic element to be operated in a "normal mode". In this "normal mode", the electronic element reacts in a customary manner to signals of a 2-value logic. At the same time, however, the electronic element can also be operated in a "test mode" by means of the use of the signal of a 3-value logic. It is thus possible to change over between the "normal mode" and the "test mode".

Consequently, the electronic element or test system can mask actual value signals corresponding to an undefined state without increasing the number of test system channels. The control information to be stored in the test system is not increased in this case, as would be the case for masking by means of masking signals to be transmitted separately from the test system to the electronic element. The test coverage (the number of test information items that can be utilized) is increased for the same number of test system channels since the actual value signals which correspond to an undefined state can be masked out individually in each case without additional test channels. Therefore, without increasing the tester channels and without increasing the memory, the actual value signals which correspond to an undefined state can be masked out bit by bit at the comparator circuit of the electronic element. This provides a prerequisite for the use of cost-effective test hardware, such as the ATE test system, by way of example. It is possible to use cost-effective test systems with tester channels without a comparator in the test system.

Furthermore, the electronic element and the test system can also be used better for functional tests. A functional test is a test in which no specific scan test signal sequence is used as the test signal sequence. The better usability results from significantly more actual value signals with an undefined state occur than in the case of specific scan test signal sequences. This has the effect that the test coverage is reduced in the case of functional tests. The data to be compared e.g. the actual value signals in many cases result from a scan test. However, the method can also be employed for comparing data, e.g. the actual value signals of functional test patterns without the use of scan chains. The comparison of digital data streams such as are used in analog tests is likewise possible.

Turning now to the figures, FIG. 1 shows a schematic illustration of a test system 100 and of an electronic element 101 which is to be tested and is coupled thereto. The test system 100 has a vector memory 102, which stores test signals (stimuli) and desired value signals (expected responses). Furthermore, the test system 100 has a plurality of first output terminals 103, 104, 105 and 106 for each electronic element to be tested. Only four first output terminals 103, 104, 105 and 106 are illustrated in FIG. 1 for the sake of clarity. In addition, the test system 100 has a plurality of second output terminals 107, 108, 109 and 110. The number of first output terminals and the number of second output terminals of the test system are identical in the case of the standard scan test, but need not be identical in other scan test variants. By way of example the test variants in which generation, redistribution, or decompression is performed proceeding from input data situated on the electrical circuit. The test system has at least one input terminal 125. It is possible to provide an arbitrary number of first and second output terminals.

The electronic element 101 to be tested, in one embodiment, comprises a semiconductor chip. The electronic element 101 has a multiplicity of electronic components, including storing components (flip-flops) and logic gates or digital logic, such as, for example, AND gates, OR gates, EXCLUSIVE-OR gates, NOT gates, etc. A plurality of the storing components is coupled to form scan chains 111, 112, 113 and 114 for the purpose of carrying out a scan test. Only four scan chains 111, 112, 113 and 114 are shown for the sake of better clarity. In the case of the standard scan test, the four scan chains 111, 112, 113 and 114 in each case have an input terminal 126, 127, 128, 129, each of the input terminals 126, 127, 128, 129 respectively being coupled to one of the first output terminals 103, 104, 105 and 106 of the test system 100.

Furthermore, the semiconductor chip 101 is a comparator circuit 115. The comparator circuit 115 has first input terminals 116, 117, 118 and 119 and second input terminals 120, 121, 122 and 123. A respective first input terminal is coupled to a respective output terminal of the scan chains 111, 112, 113 and 114, while a respective second input terminal 120, 121, 122 and 123 of the comparator circuit 115 is coupled to a respective second outlet terminal 107, 108, 109 and 110 of the test system 100. The comparator circuit 115 additionally has an output terminal 124 coupled to the input terminal 125 of the test system 100.

A signal can be made available to the input terminals 126, 127, 128 and 129 of the scan chains 111, 112, 113 and 114 during a scan test by means of the first output terminals 103, 104, 105 and 106. The scan chains 111, 112, 113 and 114 are thus driven externally. During a first phase of the scan test, the "shift phase", a scan test signal sequence stored in the vector memory 102 of the test system 100 is made available by means of the test system 100, that is to say is fed to the input terminals 126, 127, 128 and 129 of the scan chains 111, 112, 113 and 114. This is done in clocked fashion, that is to say that a respective scan test signal is present at a respective first output terminal 103, 104, 105 and 106 and thus at the input terminals 126, 127, 128 and 129 of the semiconductor chip 101 that are coupled to the first output terminals 103, 104, 105 and 106. With the next clock cycle, this signal is advanced by one component of the scan chain 111, 112, 113 and 114 and is thus present at the second storing components of the scan chain 111, 112, 113 and 114, while a new scan test signal is applied to the first components of the scan chain 111, 112, 113 and 114. Overall, the number of clock cycles of the shift phase is equal in magnitude to the number of storing components contained in the scan chain 111, 112, 113 and 114. If the scan chains 111, 112, 113 and 114 have e.g. 500 elements, then the shift phase has 500 clock cycles. After the end of the shift phase, a scan test signal is thus present at each storing component of the scan chain 111, 112, 113 and 114.

In a second phase of the scan test, the chip to be tested is operated in the "normal mode" for exactly one clock cycle, that is to say that the chip 101 is operated in accordance with its normal function. In this case, by means of the scan test signal provided at the respective storing components of the scan chain 111, 112, 113 and 114, a respective partial actual value signal is generated at a respective functional input of a storing component of the scan chain 111, 112, 113 and 114. All the partial actual value signals of a scan chain 111, 112, 113 and 114 together form an actual value signal of a scan chain 111, 112, 113 and 114.

During a third phase of the scan test, the partial actual value signals of the electronic components are shifted through the respective scan chain 111, 112, 113 and 114 in clocked fashion and are ready at the output terminal of the respective scan chain 111, 112, 113 and 114 or at the first input terminals 116, 117, 118 and 119 of the comparator circuit 115 that are coupled thereto. That is to say that the partial actual value signals and thus the respective actual value signal which were generated during the second phase of the scan test are read out at the respective output terminal of the scan chain 111, 112, 113 and 114.

Since the output terminals of the scan chains 111, 112, 113 and 114 are coupled to the first input terminals 116, 117, 118 and 119 of the comparator circuit 115, the actual value signals of the individual scan chains 111, 112, 113 and 114 are available in the comparator circuit 115. At the same time, in a manner clocked with the same clock signal, desired value signals are fed to the second input terminals 120, 121, 122 and 123 of the comparator circuit 115 by the test system, which desired value signals are read out from the vector memory 102 at the second outputs 107, 108, 109 and 110 of the test system 100 and are made available to the comparator circuit 115.

The actual value signals of the scan chains 111, 112, 113 and 114 and desired value signals stored in the vector memory 102 are thus available simultaneously to the comparator circuit 115. The comparator circuit 115 compares the actual value signals with the desired value signals and provides the result of the respective comparison at its output terminal 124.

The comparator circuit thus generates significantly fewer output data than would be generated for a scan test. Moreover, intensified parallelization of the test is achievable since there are practically only input data for the electronic element 101. In other words, the semiconductor chip and input data are better suited to a parallelized processing than output data by means of known methods.

Figure 2:
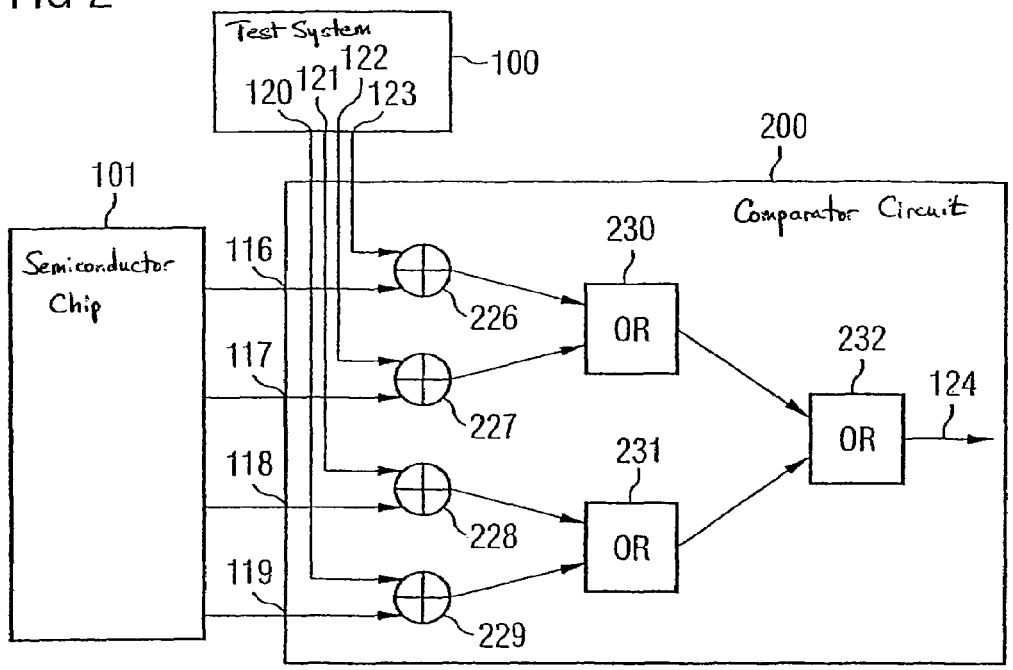
FIG. 2 shows a schematic illustration of one non-X-tolerant comparator circuit in accordance with one exemplary embodiment of the invention which can be arranged on the electrical element.

FIG. 2 schematically illustrates a first comparator circuit 200 in the electronic element 101. The embodiment illustrated is only by way of example, it being possible to use any known comparator circuit. Using four scan chains 111, 112, 113 and 114, the comparator circuit has the four first input terminals 116, 117, 118 and 119 and the four second input terminals 120, 121, 122 and 123, which are coupled to the output terminals of the scan chains 111, 112, 113 and 114 and, respectively, the second output terminals 107, 108, 109 and 110 of the test system.

A first stage of the comparator circuit 105 has four EXOR circuits 226, 227, 228 and 229 (EXCLUSIVE-OR gates). The EXOR circuits 226, 227, 228 and 229 each have two input terminals, of which one input terminal is respectively coupled to a first input terminal 116, 117, 118 and 119 of the comparator circuit 200, while the respective second input terminal of the EXOR circuits 226, 227, 228 and 229 is coupled to a respective second input terminal 120, 121, 122 and 123 of the comparator circuit 200. Furthermore, each EXOR circuit 226, 227, 228 and 229 has an output terminal.

The comparator circuit 200 has a second stage in the form of two OR circuits 230 and 231 (OR gates). Each OR circuit 230 and 231 has two input terminals and an output terminal. The input terminals of the OR circuits 230 and 231 of the second stage are coupled to the outputs of the EXOR circuits 226, 227, 228 and 229 of the first stage.

The comparator circuit 200 has a third stage in the form of an OR circuit 232 (OR gate) having two input terminals and an output terminal. This output terminal is the output terminal 124 of the comparator circuit 200.

This 3-stage construction is illustrated by way of example for the case of four scan chains 111, 112, 113 and 114. If more than four scan chains are present, the number of stages of the comparator circuit is correspondingly increased if the only one output terminal of the comparator circuit is desired.

If, in the second shift phase of the scan test, that is to say the read-out phase of the actual value signals, the partial actual value signals are present at the first input terminals 116, 117, 118 and 119 and the partial desired value signals are simultaneously present at the second input terminals 120, 121, 122 and 123, then the comparator circuit 200 in each case compares a partial desired value signal with the corresponding partial actual value signal. In the case where all the partial desired value signals match the corresponding partial actual value signals, a value of logic "0" is present at the output 124 of the comparator circuit 200. In other words, all the scan chains 111, 112, 113 and 114 supply an expected result and none of the storing components supplies an error. By contrast, a value of logic "1" is present at the output terminal 124 of the comparator circuit 200 if, even only in one scan chain 111, 112, 113 and 114, the partial actual value signal does not match the corresponding partial desired value signal.

The comparator circuit illustrated in FIG. 2 is non-X-tolerant. That is to say that if a partial actual value signal has a value which is not defined (an X signal), then an X state is also produced at the output terminal 124 of the comparator circuit 200. An X state is a state that is not defined. Such a state is not desirable in a scan test since it cannot be decided whether or not an error is present and, as a result, does not contribute to increasing the test coverage.

One possibility for using such a non-X-tolerant comparator circuit in a scan test can be seen, for example, in using a scan test signal sequence that is predetermined such that it is ensured that an X state occurs at none of the storing components of the electronic circuit. Consequently, no X state can occur for the partial actual value signals and, therefore, the comparator circuit 200 also does not generate an X state at its output.

Figure 3:
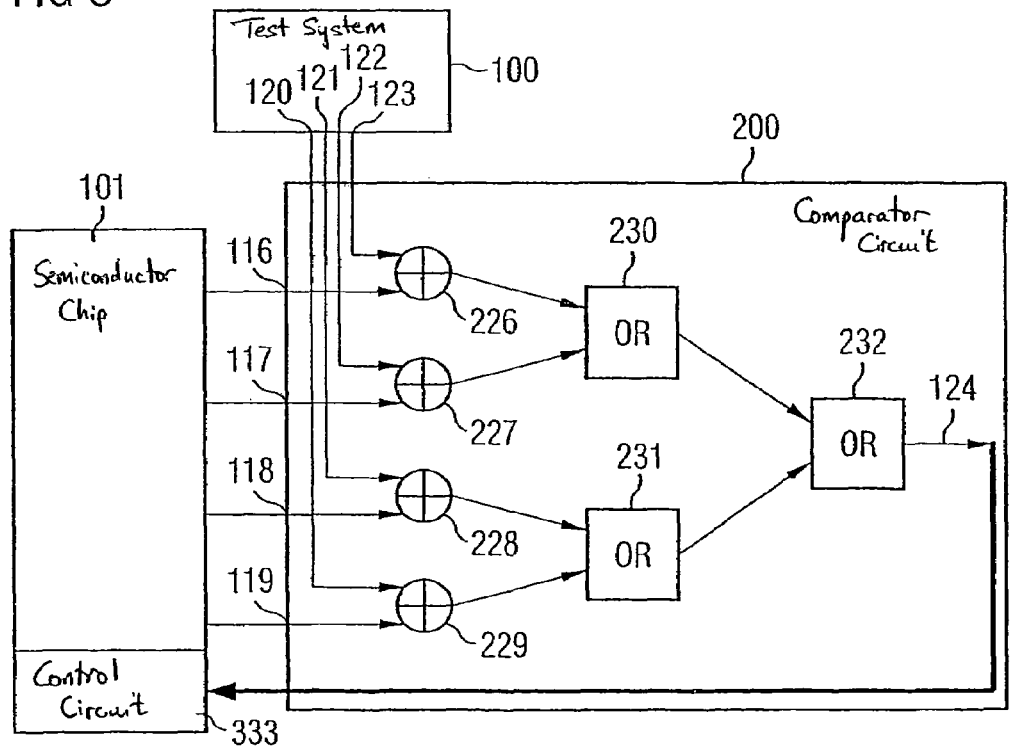
FIG. 3 shows a schematic illustration of another non-X-tolerant comparator circuit in accordance with one exemplary embodiment of the invention which can be arranged on the electrical element.

FIG. 3 schematically illustrates an apparatus in which the comparator circuit 200 is similar to that of FIG. 2. However, in this embodiment, the output signal present at the output terminal 124 of the comparator circuit 200 is not forwarded to the input terminal 125 of the test system 100.

The electronic element 101 additionally has a control element 333. A control input of the control element 333 is coupled to the output terminal 124 of the comparator circuit 200. Consequently, the output signal of the comparator circuit 200 is applied to the control element 333. If the output signal indicates that an error of a storing component has occurred during the scan test, the control element 333 stops the further clock sequence of the read-out signal. The state of at least the tested storing components of the electronic circuit is frozen and can be read out in detail in order that a diagnosis can be carried out. The individual partial actual value signals of all the chains 111, 112, 113 and 114 can still be accessed since the comparison is carried out by means of the integrated comparator circuit 200 simultaneously with the read-out of the data from the scan chains 111, 112, 113 and 114. Thus, it is also still possible to determine the individual respective scan chain 111, 112, 113 and 114 in which an error has occurred, i.e. a partial actual value signal does not match the relevant partial desired value signal. Consequently, a diagnosis can be carried out to the effect of whether, by way of example, the storing component that generates the error generates an error in accumulated fashion.

Feedback thus takes place between the output of the comparator circuit 200 and the input of the comparator circuit 200 such that if a signal is present at the output terminal of the comparator circuit 200, the feeding in of the actual value signal sequence and the desired value signal sequence can be stopped. Without feedback, a specific error diagnosis of which of the scan chains 111, 112, 113 and 114 is supplying an error may not be possible. This feedback and the associated freezing of the state of the storing components are important in practice primarily because an actual semiconductor chip has significantly more scan chains than the four scan chains 111, 112, 113 and 114 illustrated here. Consequently, a comparator circuit 200 in practice also has significantly more stages than the three stages illustrated here. This means that a greater parallelization of the test can be carried out by means of the comparator circuit 200. However it becomes more difficult to make a statement about the scan chain 111, 112, 113 and 114 in which the partial actual value signal does not match the partial desired value signal if a signal which signals an error is present at the output. A diagnosis of a possible error source is made greatly difficult as a result of this.

Figure 4:
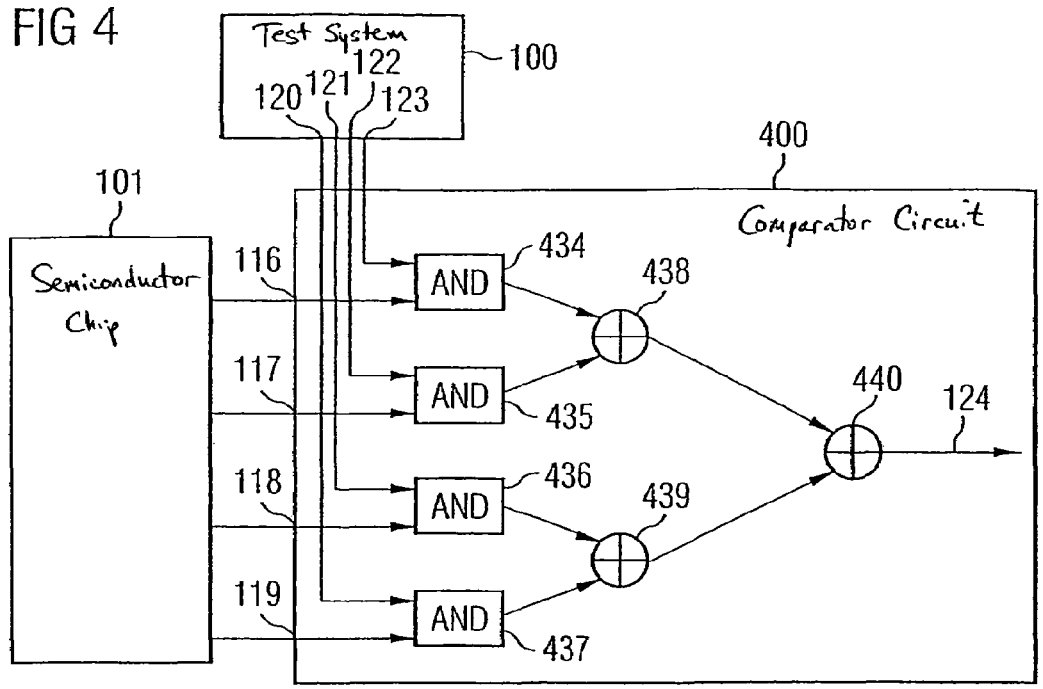
FIG. 4 shows a schematic illustration of one X-tolerant compressor in accordance with one exemplary embodiment of the invention which can be arranged on the electronic element.
Figure 5:
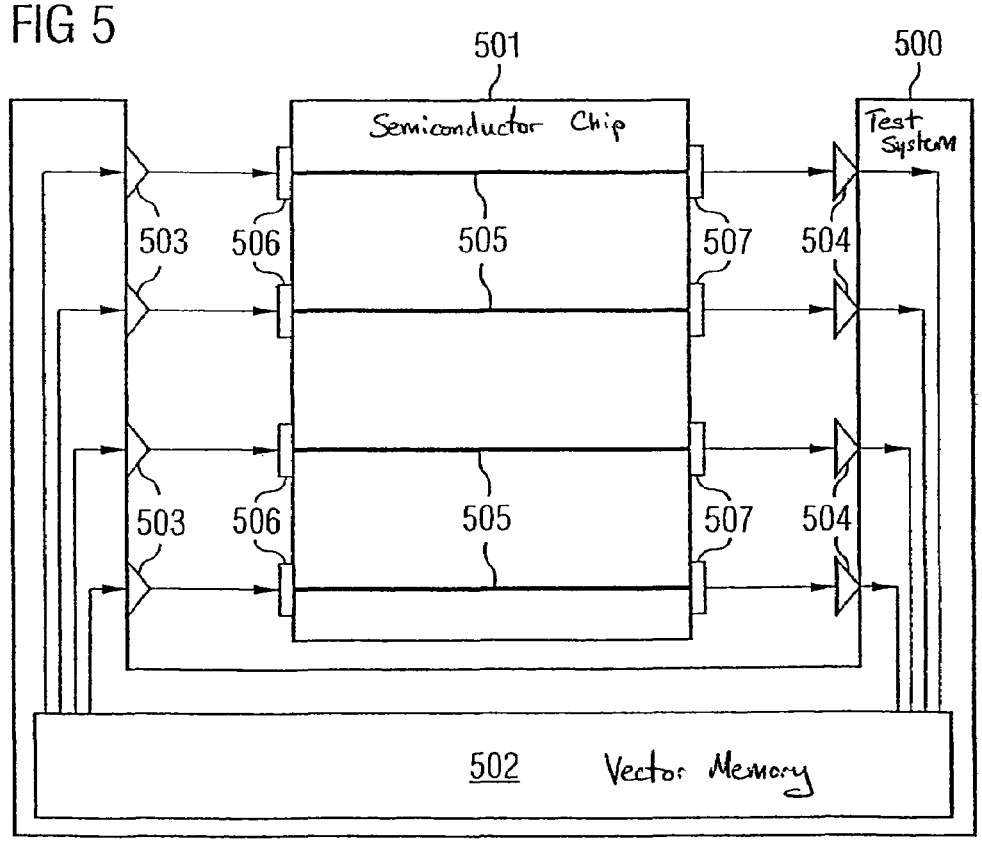
FIG. 5 shows a schematic illustration of a test system and of an electronic element in accordance with the prior art.

FIG. 4 illustrates a schematic illustration of an X-tolerant comparator circuit 400 in accordance with a second embodiment. The X-tolerant comparator circuit 400, too, is once again shown by way of example for an electronic circuit having four scan chains 111, 112, 113 and 114. Accordingly, the comparator circuit 400 has four first input terminals 116, 117, 118 and 119 and four second input terminals 120, 121, 122 and 123 which are coupled to the output terminals of the scan chains 111, 112, 113 and 114 and, respectively, second output terminals 107, 108, 109 and 110 of the test system 100.

A first stage of the comparator circuit 400 has four AND circuits 434, 435, 436 and 437, (AND gates). The AND circuits 434, 435, 436 and 437 each have two input terminals of which one input terminal is respectively coupled to one of the first input terminals of the comparator circuit 400. The respective second input terminal of the AND circuits 434, 435, 436 and 437 is coupled to a respective one of the second input terminals of the comparator circuit 400. Furthermore, each AND circuit 434, 435, 436 and 437 has an output terminal.

The comparator circuit 400 has a second stage in the form of two EXOR circuits 438 and 439 (EXCLUSIVE-OR gates), each EXOR circuit 438 and 439 having two input terminals and an output terminal. The input terminals of the EXOR circuits 438 and 439 of the second stage are coupled to the outputs of the AND circuits of the first stage. The comparator circuit 400 also has a third stage in the form of an EXOR circuit 440 (EXCLUSIVE-OR gate) having two input terminals and an output terminal. This output terminal is the output terminal 124 of the comparator circuit 400.

The comparator circuit 400 illustrated in FIG. 4 constitutes a compressor which can simultaneously be used as a comparator. If, in the second shift phase of the scan test (the read-out phase of the actual value signals) the actual value signals of the first input terminals 116, 117, 118 and 119 and the desired value signals are simultaneously present at the second input terminals 120, 121, 122 and 123, then the comparator circuit 400 compresses the signals. This is to say that the comparator circuit 400 reduces the four signals of the four scan chains to a single signal. Furthermore, it simultaneously compares a respective desired value signal with the corresponding actual value signal. In the case where all the desired value signals match the corresponding actual value signals, a signal that indicates that all the scan chains 111, 112, 113 and 114 have supplied an expected result and none of the electronic components has supplied an error is present at the output 124 of the comparator circuit 400.

In contrast to the comparator circuit 200 illustrated in FIG. 2, however, the signal indicating that no error occurred in the scan chain 111, 112, 113 and 114 is present at the output 125 of the comparator circuit 400 illustrated in FIG. 4 even when an error occurred in an even number of scan chains 111, 112, 113 and 114. Consequently, an odd number of errors can be detected by means of the comparator circuit 400 illustrated in FIG. 4. In this case, it is possible to decide whether an error was present, but not the scan chain in which the error was present. However, this comparator circuit 400 is X-tolerant. Thus, even a non-defined state of an actual value signal does not prevent the usability of the signal present at the output of the comparator circuit.

FIG. 6 shows a second schematic illustration of the test system 100 as shown in FIG. 1 and of the electronic element 101 which is to be tested and is coupled thereto. For the sake of clarity only two scan chains 111 and 112 are illustrated schematically in FIG. 6, which are coupled to first input terminals 116 and 117 of the comparator circuit 115. However, the number of scan chains may be significantly higher or may be equal to 1. In addition, only two second input terminals 120 and 121 of the comparator circuit 115 are illustrated. Moreover, only two second output terminals 107 and 108 of the test system 100 in FIG. 6 are shown in the test system 100. In FIG. 6, however, the electronic element 101 additionally has a first input pad 650 and a second input pad 651. The first input pad 650 has an input terminal 652 coupled to the second output terminal 107 of the test system 100 and an output terminal 653 coupled to the second input terminal 120 of the comparator circuit 115. The second input pad 651 has an input terminal 654 coupled to the second output terminal 108 of the test system 100, and an output terminal 655 coupled to the second input terminal 121 of the comparator circuit 115. Furthermore, FIG. 6 illustrates that the output terminal 124 of the comparator circuit 115 and the input terminal 125 of the test system 100 are coupled to one another.

In accordance with the configuration of the test system arrangement as is illustrated in FIG. 1 and FIG. 6 has comparators. Thus, the test system can ignore actual signal values which correspond to an undefined state and which are present at the output of the electronic element.

FIG. 7 shows the test system 100 as shown in FIG. 6 and an electronic element 101 which is coupled thereto. For the sake of clarity, once again only two scan chains 111 and 112 are illustrated schematically in FIG. 7, which are coupled to first input terminals 116 and 117 of the comparator circuit 115. Furthermore, the illustration also shows only two second input terminals 120 and 121 of the comparator circuit 115. Moreover, only two second output terminals 107 and 108 of the test system 100 are illustrated for the test system 100 in FIG. 7. As with FIG. 6, the electronic element 101 additionally has a first input pad 650 and a second input pad 651. The first input pad 650 has an input terminal 652 coupled to the second output terminal 107 of the test system 100 and an output terminal 653 coupled to the second input terminal 120 of the comparator circuit. The input pad 651 has an input terminal 654 coupled to the second output terminal 108 of the test system 100, and an output terminal 655 coupled to the second input terminal 121 of the comparator circuit 115. In addition, FIG. 7 illustrates the output terminal 124 of the comparator circuit 115 and the input terminal 125 of the test system 100, which are coupled to one another.

In addition, however, the test system 100 shown in FIG. 7 has an additional output terminal 756 (also referred to as terminal pin) coupled to an additional input terminal 757 of the comparator circuit 115. By means of this additional output terminal 756, it is possible to provide the comparator circuit 115 with a signal which can be used to mask all the actual value signals if an actual value signal has an undefined state. In this case, the information present at each scan chain is rejected as soon as at least one actual value signal has an undefined state. In the configuration shown in FIG. 7, the comparator circuit 115 can simultaneously mask out the comparison of the information bits of all the scan chains. However, this reduces the test coverage since even upon the occurrence of an individual non-defined value within a clock cycle, the information present at each individual scan chain in this clock cycle is rejected.

The additional digital input terminal 757 at the electrical element 101 and the additional digital output terminal 756 at the test system 100 are also used for transmitting the control function regarding the clock cycle within which a comparison is to be masked out from the test system to the electronic element 101. The electronic element 101 has a control element 758, which is set up such that, depending on the result of the comparison of the comparator circuit, a state of an electronic circuit to be tested of the electronic element can be held unchanged. The control element 758 thus serves to freeze the state of the electronic circuit to be tested.

Figure 8:
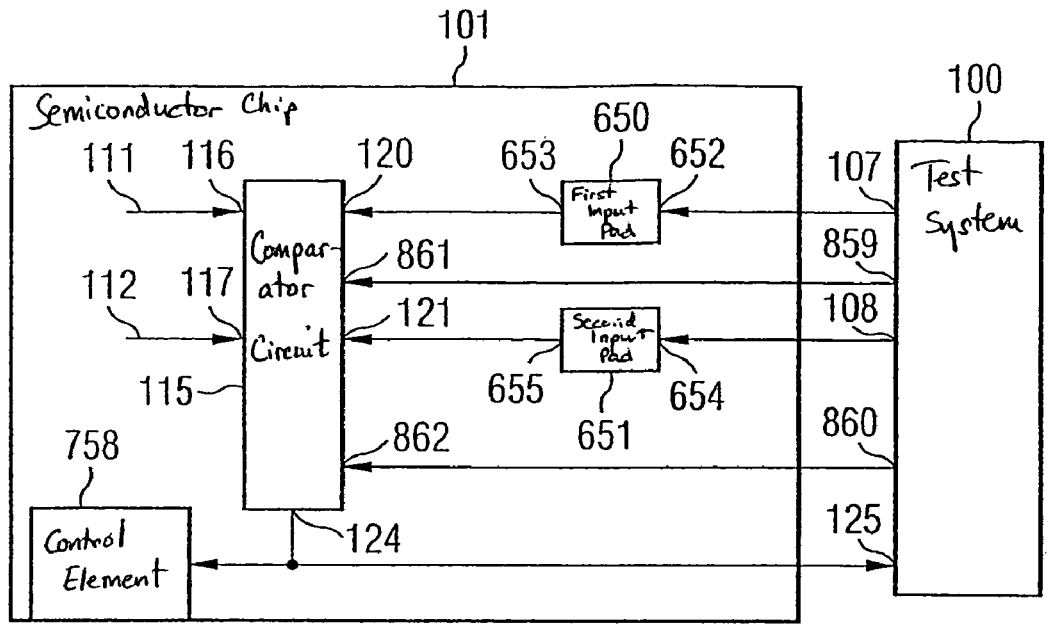
FIG. 8 shows a schematic illustration of a test system arrangement according to the invention in which, for each second input terminal, an additional terminal pin is formed for providing a signal for masking actual value signals having an undefined state.

FIG. 8 again shows the test system 100 shown in FIG. 7 and an electronic element 101 which is coupled thereto. For the sake of clarity, once again only two scan chains 111 and 112 are illustrated schematically in FIG. 8, which are coupled to the first input terminals 116 and 117 of the comparator circuit 115. The illustration also shows only two second input terminals 120 and 121 of the comparator circuit 115. Moreover, only two second output terminals 107 and 108 of the test system 100 are illustrated for the test system 100 in FIG. 8. As with FIG. 7, the electronic element 101 additionally has a first input pad 650 and a second input pad 651. The first input pad 650 has an input terminal 652 coupled to the second output terminal 107 of the test system 100 and an output terminal 653 coupled to the second input terminal 120 of the comparator circuit. The second input pad 651 has an input terminal 654 coupled to the second output terminal 108 of the test system 100, and an output terminal 655 coupled to the second input terminal 121 of the comparator circuit. FIG. 8 illustrates the output terminal 124 of the comparator circuit 115 and the input terminal 125 of the test system 100, which are coupled to one another.

In addition, however, the test system 100 has additional output terminals 859 and 860 coupled to additional input terminals 861 and 862 of the comparator circuit 115. In general, the number of additional output terminals of the test system and of additional input terminals of the comparator circuit is equal to the number of scan chains which the electronic element 101 has, that is to say that it is significantly higher than the number of two as illustrated in FIG. 8. In principle, there are electrical circuits having greater than or equal to one scan chain. By means of these additional output terminals 859 and 860, it is possible to provide the comparator circuit 115 with signals which can be used to mask individual actual value signals if the respective individual actual value signal has an undefined state. In this case, only the information present at each individual scan chain is rejected. In the configuration shown in FIG. 8, therefore, the comparator circuit 115 can mask out the comparison of the information bits of individual scan chains. The test coverage is thereby increased compared with the configuration shown in FIG. 7. However the additional digital input terminals 859 and 860 and the additional digital output terminals 861 and 862 from the test system to the electronic element 201 are also used for transmitting the control functions regarding the clock cycle within which a comparison is to be masked out. This doubles both the tester channels between test system 100 and the electronic element 101 and the vector memory in the test system, since additional control information items are to be stored.

Furthermore, the electronic element 101 has a control element 758, which is set up such that, depending on the result of the comparison of the comparator circuit, a state of the electronic circuit to be tested can be held unchanged. The control element 754 thus serves to freeze the state of the electronic circuit to be tested.

Figure 9:
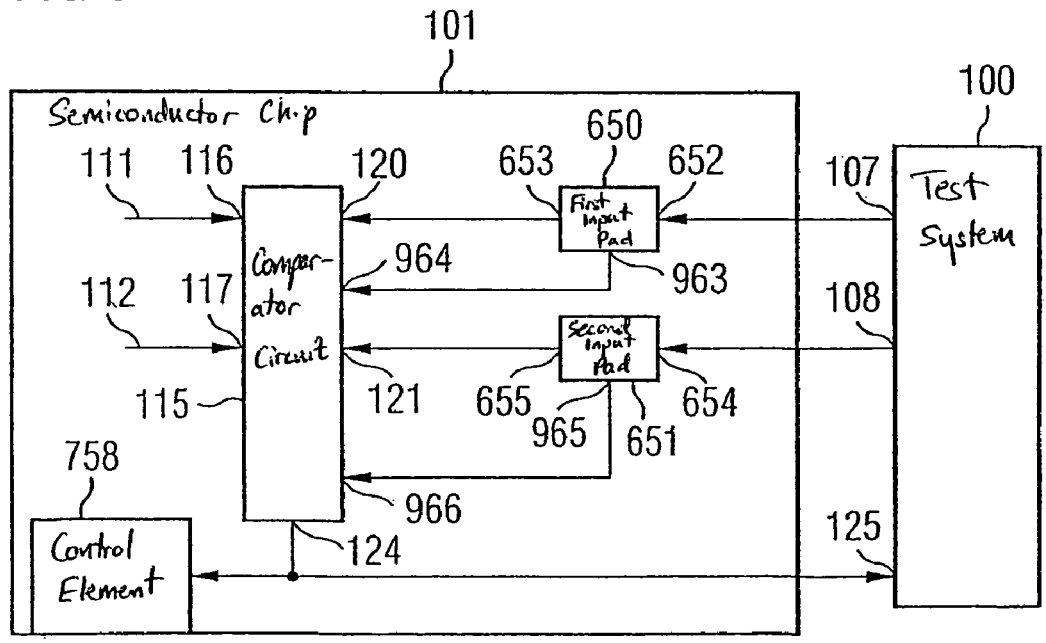
FIG. 9 shows a schematic illustration of a test system arrangement in accordance with an additional aspect of the invention.

FIG. 9 shows a test system arrangement that has a test system 100 and an electronic element 101 coupled thereto. For the sake of clarity, once again only two scan chains 111 and 112 are illustrated schematically in FIG. 9, which are coupled to first input terminals 116 and 117 of the comparator circuit 115. Furthermore, the illustration also shows only two second input terminals 120 and 121 of the comparator circuit 115. Moreover, only two second output terminals 107 and 108 of the test system 100 are illustrated for the test system 100 in FIG. 9. As with FIG. 8, the electronic element 101 additionally has a first input pad 650 and a second input pad 651. The first input pad 650 has an input terminal 652 coupled to the second output terminal 107 of the test system 100 and an output terminal 653 coupled to the second input terminal 120 of the comparator circuit. The second input pad 651 has an input terminal 654 coupled to the second output terminal 108 of the test system 100, and an output terminal 655 coupled to the second input terminal 121 of the comparator circuit. In addition, the first input pad 650 also has a second output terminal 963 coupled to an additional input terminal 964 of the comparator circuit 115. The second input pad 651 has a second output terminal 965 coupled to an additional input terminal 966 of the comparator circuit 115. Furthermore, FIG. 9 illustrates the output terminal 124 of the comparator circuit 115 and the input terminal 125 of the test system 100, which are coupled to one another.

By means of the additional output terminals 963 and 965 of the first input pad 650 and of the second input pad 651, respectively, it is possible to provide the comparator circuit 115 with signals which can be used to mask individual actual value signals if the respective individual actual value signal has an undefined state. In this case, only the information present at each individual scan chain is rejected. In the configuration shown in FIG. 9, therefore, the comparator circuit 115 can mask out the comparison of the information bits of individual scan chains. The test coverage is just as high in a test system arrangement as illustrated schematically in FIG. 9 as in a test system arrangement as illustrated in FIG. 8. However the number of tester channels used (second output terminals of the test system) is low in this test system arrangement. Consequently, a test system arrangement as illustrated in FIG. 9 can increase the parallelism of a scan test compared with the prior art. For generating the masking signals which the input pads make available to the comparator circuit 115, use is made of a third logic level of the desired value signals which are provided at the second output terminals of the test system 100. The generation and detection of this third logic level are explained in more detail in the subsequent figures.

Figure 10:
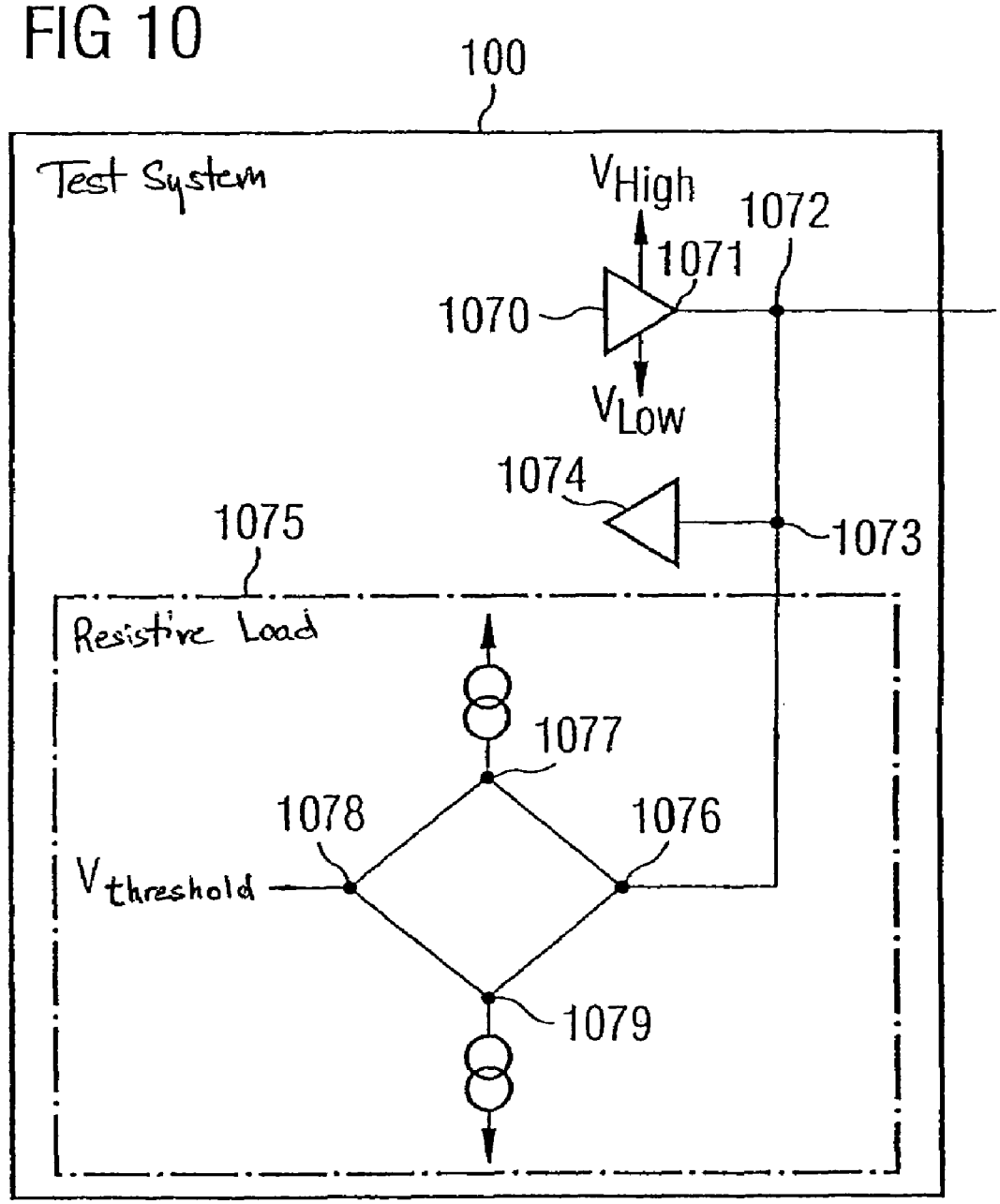
FIG. 10 shows a schematic illustration of a test system with a resistive load which can be used for forming a third logic level.

FIG. 10 schematically illustrates part of an exemplary test system 100 by means of which a desired value signal of a 3-value logic (high level, low level and an intermediate level) can be generated instead of a desired value signal of a 2-value logic (high level and low level). The test system 100 has a driver 1070 which is used to provide the high level and the low level of the 3-value logic. An output 1071 of the driver 1070 is coupled to a first node 1072 of the test system 100. The first node 1072 is coupled to a second node 1073. The second node is coupled to a comparator 1074. The second node 1073 is coupled to an emulated resistive load 1075 used to provide the intermediate level.

This simulated resistive load 1075 may be formed, for example, by means of a diode bridge or bridge rectifier. The diode bridge has four nodes 1076, 1077, 1078 and 1079 and four diodes (not shown). The node 1076 of the diode bridge is coupled to the node 1077 of the diode bridge by means of a first diode. The node 1076 of the diode bridge is coupled to the node 1079 of the diode bridge by means of a fourth diode. The node 1077 of the diode bridge is coupled to the node 1078 of the diode bridge by means of a second diode. The node 1077 of the diode bridge is coupled to a first programmable current source. The node 1079 of the diode bridge is coupled to the node 1078 of the diode bridge by means of a third diode. The node 1079 of the diode bridge is coupled to a second programmable current source.

The levels "logic 0" ($V_{LOW}$), "logic 1" ($V_{High}$) and "logic center" ($V_{Threshold}$) are processed in the context of a 3-value logic. By means of $V_{Threshold}$ at the node 1078, it is possible to feed in a level which is also set at the node 1076 in the settled state of the diode bridge and can thus be used as an intermediate level of the 3-value logic.

Consequently, signals of a 3-value logic can be provided at the first node 1072 by the test system 100. The driver 1070 provides the signal corresponding to the logic value "1" and the signal corresponding to the logic value "0." If the driver 1070 of the test system is switched off, the resistive load of the test system performs the driving of the center level (intermediate level=$V_{Threshold}$) of the 3-value logic. The first node 1072 simultaneously constitutes one of the second output terminals of the test system which are in each case coupled to an input pad of the electronic element.

The parts of a test system that are illustrated schematically in FIG. 10 are to be understood only by way of example. There are numerous possibilities as to how the test system can be set up such that it can provide signals of a 3-value logic. Moreover, FIG. 10 only illustrates a test system having one second output terminal, whereas a test system used in a test system arrangement has a plurality of second output terminals coupled to a plurality of second input terminals of the electronic element. As an alternative to the programmable load circuit explained with reference to FIG. 10, the test system can also generate the third logic level with an extended functionality. Such circuits are used, for example, for programming nonvolatile memories. The technical realization is possible in diverse ways in this case.

FIG. 11 schematically illustrates part of the test system arrangement in accordance with the additional aspect. The schematic test system of FIG. 10 is illustrated again on the left-hand side. The first node 1072 of the test system 100 (a second output terminal of the test system 100) is in this case coupled to a first node 1180 of an input pad 650 of the electronic element. The input pad 650 is set up for processing signals of a 3-value logic. The adaptation of the input pad, in order to be able to process signals of a 3-value logic, consists in the implementation of a functional block 1181 which interprets the third logic level. The functional block 1181 is illustrated schematically in FIG. 11 and may be embodied for example by means of two inverters. The functional block 1181 provides a masking signal through the interpretation of the third logic level. The masking signal is provided at a second output terminal 963 of the input pad 650. The second output terminal 963 is coupled to an additional input terminal 964 of the comparator circuit 115. The comparator circuit 115 is typically a 1-bit comparator circuit which compares signals with one another bit by bit. In addition to the functional block 118, the input pad 650 also has an additional functional block 1182 serving for interpreting the low level and the high level. The additional functional block 1182 may be formed in a known manner and provides the signal which it generates at a first output terminal 653 of the input pad 650. The first output terminal 653 of the input pad 650 is coupled to a second input terminal 120 of the comparator circuit 115.

The adaptation of the input pads to a 3-value logic may be effected by means of the use of a functional block as explained above. This functional block may be embodied in a simple manner by means of two inverters. This uses only a slight increase in the space of the input pad, which is of the order of magnitude of approximately 1%.

It must be taken into consideration in this case that the input pad, even after the adaptation for the interpretation of signals of a 3-value logic, can be operated normally and in an unrestricted manner in normal operation, that is to say when for example precisely no scan test is being carried out. The outputting, i.e. the provision of the output signals of the input pad, functions as in the case of an input pad which is not adapted for the interpretation of signals of a 3-value logic. The input signals for the input pad in normal operation are also identical to the input signals for an input pad which is not adapted for the interpretation of signals of a 3-value logic. In the actual scan test, which is a dedicated test mode, the input pad is changed over from 2-value logic to 3-value logic. In other words, the input pad can interpret the levels "logic 0" ($V_{LOW}$), "logic 1" ($V_{High}$) and "logic center" ($V_{Threshold}$), which are made available by the test system. As already described, these three levels can be generated in a simple manner by the test system.

In the electronic element, e.g. a chip, the information of the individual logic levels, for example on the input pad, is divided between two signals (2-value logic) which are then forwarded by via separate paths to the comparator circuit of the electronic element.

By way of example, Table 1 specifies a 3-value interpretation logic of the test mode.

TABLE 1

| Test System | Path 1 (2-value) | Path 2 (2-value) |
|---|---|---|
| 3-value Log 0 | Log 0* | Valid = Log 0 |
| 3-value Log 1 | Log 1* | Valid = Log 0 |
| 3-value Log C | Log 0* = $V_{Threshold}$ < e.g. ~1.5 V<br>Log 1* = $V_{Threshold}$ < e.g. ~1.5 V | Masking = Log 1 |

On the basis of Table 1, it is evident how the masking information which are transmitted via a second path, that is to say a coupling between the second output terminal of the input pads and an additional input terminal of the comparator circuit, to the comparator circuit. In the embodiment, a signal having a reference value of 1.5V is assumed as input threshold for a signal of the 2-value logic. Thus, a signal having a voltage value of <1.5V is interpreted as a low level, whereas a signal having a voltage value of >1.5V is interpreted as a high level.

One possible realization of the different input levels of the 3-value logic may appear as follows. A signal of 0V to 0.8V is interpreted as a signal which represents the logic value "0" of a 3-value logic. A signal of 1.0V to 2.0V is interpreted as a signal which represents the logic value "C" of a 3-value logic. A signal of 2.0V to 3.3V is interpreted as a signal which represents the logic value "1" of a 3-value logic.

If the test system provides a signal corresponding to the logic level "0" (low level) of the 3-value logic, this is divided by the input pad as follows between two signals of a 2-value logic. A logic value "0" is communicated to the comparator circuit via a first path, which couples the first output terminal of the input pad to a second input terminal of the comparator circuit. A logic value "0" is also communicated via the second path.

If the test system provides a signal corresponding to the logic level "1" of the 3-value logic, this is divided by the input pad as follows between two signals of a 2-value logic. A logic value "1" is communicated to the comparator circuit via the first path, whereas a logic value "0" is communicated via the second path.

If the test system provides a signal corresponding to the logic level "C" of the 3-value logic, that is to say the center level, this is divided by the input pad as follows between two signals of a 2-value logic. In the case where the signal of the test system has a voltage value of less than 1.5V, a logic value "0" is communicated to the comparator circuit via the first path and a logic value "1" is communicated via the second path. In the case where the signal of the test system has a voltage value of more than 1.5V, a logic value "1" is communicated to the comparator circuit via the first path and a logic value "1" is communicated via the second path. In the case where the logic value "1" is communicated to the comparator circuit via the second path, this means for the comparator circuit that the relevant actual value signal is to be masked. The center level of the 3-value logic does not have to be used for the interpretation of whether a relevant actual value signal has to be masked.

As can easily be seen on the basis of the table, given this configuration of the input levels and this choice of the input levels, the input pad can be operated in normal operation without any functional impairment since the output signals of the input pad in the case of input signals of a 2-value logic correspond to the output signals of the input pad in the case of input signals of a 3-value logic.

It should furthermore be noted that the input levels chosen can be chosen freely since the test system can generate levels of the signals simply and accurately. In the design of the functional block of the input pad, importance can therefore be attached to a simple and area-saving implementation rather than on the use highly accurate components. Furthermore, it should be noted that the switching speed of the input pad is not slowed down in the case of the implementation in accordance with the embodiment.

To summarize, an electronic element is provided. The electronic element is, e.g. a semiconductor chip, comprising an electronic circuit to be tested. A comparison and/or compression of actual value signals of a scan test or functional test or analog test with digital output is carried out directly by means of a comparator circuit on the electronic element. This greatly reduces the volume of data arising which is to be transmitted from the electronic element to a test system. The electronic element may have only one output terminal which is used for a scan test. All the other terminals of the electronic element may constitute input terminals for the electronic element. The signals which are applied via these input terminals represent input data. Input data are significantly better suited to parallelization than output data, that is to say that the test can be parallelized to a significantly greater extent by means of the intensified use of input data since input data can possibly be used multiply within the test.

According to the invention, a test assessment is effected in real time (while the test is being carried out) on an electronic element which can immediately freeze its error state. Subsequently, an evaluation of the error state is then possible under the control of the test system. Since there is a reaction to errors in real time, it is thus also possible to monitor volume (mass) production of an electronic component. Data influencing these yields can thus be recorded for statistical purposes even during the production of electronic components. This holds true even if compressors are used. The electronic circuits can also be employed in arbitrary functional tests for the functional checking of the circuit or when testing an analog circuit that supplies digital actual value signals.

By means of a design of the test system arrangement, it is possible to increase the parallelism when testing electronic circuits of an electronic element which are to be tested without in this case increasing the number of input terminals of the electronic element. Thus, more electronic circuits of an electrical element can be tested simultaneously, as a result of which firstly the production times and secondly also the production costs can be reduced.

It is therefore intended that the foregoing detailed description be regarded as illustrative rather than limiting, and that it be understood that it is the following claims, including all equivalents, that are intended to define the spirit and scope of this invention. Nor is anything in the foregoing description intended to disavow scope of the invention as claimed or any equivalents thereof.

We claim:

1. An electronic element comprising:
an electronic circuit to be tested, wherein the electronic circuit comprises a plurality of storing components coupled in series to form scan chains, wherein each scan chain has an input terminal to receive a scan test signal sequence to test the storing components of the scan chain, and an output terminal, an actual value signal of the scan chain being provided at the output terminals of the scan chain in response to the scan test signal sequence which is shifted through the scan chain; and
a comparator circuit having first input terminals and second input terminals and an output terminal, each of the output terminals of the scan chains respectively being coupled to one of the a first input terminals, the second input terminals to receive desired value signals, and the comparator circuit to compare the actual value signals provided at the output terminals of the scan chains with the desired value signals and provide the comparison to the output terminal of the comparator circuit;

wherein the electronic element is set up to process signals of a 3-value logic, wherein one of the logic levels of the 3-value logic is formed as a masking logic level to mask undefined states of the actual value signals that occur in the comparator circuit.

2. The electronic element of claim 1, wherein at least one of:

the second input terminals comprise input pads that each have a functional block which is set up such that the functional block processes the signal of the masking logic level, or the comparator circuit comprises additional input terminals which are coupled to the functional blocks.

3. The electronic element of claim 1, further comprising a control element set up such that, depending on the comparison, a state of the electronic circuit can be held unchanged.

4. The electronic element of claim 3, further comprising a clock generator to clock the electronic circuit, the clock generator coupled to the control element, the control element set up such that, depending on the comparison, the clock generator can be fed a stop signal that stops the clock generator.

5. A test system comprising:

an electronic element containing:

an electronic circuit to be tested, wherein the electronic circuit comprises a plurality of storing components coupled in series to form scan chains, wherein each scan chain has an input terminals to receive a scan test signal sequence to test the storing components of the scan chain, and an output terminals, an actual value signals of the scan chain being provided at the output terminals of the scan chain in response to the scan test signal sequence which is shifted through the scan chain, the electronic element set up to process signals of a 3-value logic, wherein one of the logic levels of the 3-value logic is formed as a masking logic level to mask undefined states of the actual value signals that occur in the comparator circuit, and a comparator circuit having first input terminals and second input terminals and an output terminal, each of the output terminals of the scan chains of the electronic circuit to be tested respectively being coupled to one of the a first input terminal, the second input terminals to receive desired value signals, and the comparator circuit to compare the actual value signals provided at the output terminals of the scan chains with the desired value signals and provide the comparison to the output terminal of the comparator circuit;

first output terminals coupled to the input terminals of the scan chain;

second output terminals coupled to the second input terminals of the comparator circuit;

a vector memory to store the scan test signal sequence and the desired value signals, and coupled to the first output terminals and to the second output terminals; and an input terminal for each of the output terminals of the comparator circuit, an input terminal being provided which is coupled to the corresponding output terminal of the comparator circuit.

6. The test system of claim 5, wherein the electronic element is set up such that two signals of 2-value logic can be generated from one signal of the 3-value logic by means of the electronic element.

7. The test system of claim 5, further comprising a resistive load which can be used to form a logic level of the 3-value logic.

8. The test system of claim 5, wherein the electronic circuit is set up such that at least one of:

a functional test can be carried out, or an analog test with digital output can be carried out.

9. The test system of claim 5, further comprising:

a control element set up such that, depending on the comparison, a state of the electronic circuit can be held unchanged, and a clock generator to clock the electronic circuit, the clock generator coupled to the control element, the control element set up such that, depending on the comparison, the clock generator can be fed a stop signal that stops the clock generator.

10. A method of testing an electronic circuit, the method comprising:

receiving a scan test signal sequence to test storing components of the electronic circuit, the storing components coupled in series to form scan chains;

shifting the scan test signal sequence through the scan chains;

providing actual value signals of a 3-value logic at outputs of the scan chains of the electronic circuit in response to the scan test signal sequence;

receiving desired value signals of the 3-value logic, wherein one of the logic levels of the 3-value logic is formed as a masking logic level to mask undefined states of the actual value signals that occur in the comparator circuit;

comparing the actual value signals with the desired value signals; and providing the comparison to an output terminal.

11. The method of claim 10, further comprising holding a state of the electronic circuit unchanged depending on the comparison.

12. The method of claim 11, further comprising:

supplying a clock signal to the electronic circuit; and stopping the clock signal to the electronic circuit depending on the comparison.

13. A method of testing an electronic circuit, the method comprising:

receiving a scan test signal sequence to test storing components of the electronic circuit, the storing components coupled in series to form scan chains;

shifting the scan test signal sequence through the scan chains;

storing actual value signals of a 3-value logic of the electronic circuit in response to the test signal sequence and desired value signals of the 3-value logic, wherein one of the logic levels of the 3-value logic is formed as a masking logic level to mask undefined states of the actual value signals that occur in the comparator circuit;

comparing the actual value signals with the desired value signals; and providing the comparison to an output terminal.

14. The method of claim 13, further comprising generating two signals of 2-value logic from one signal of the 3-value logic.

15. The method of claim 13, further comprising forming a logic level of the 3-value logic using a resistive load.

16. The method of claim 13, further comprising at least one of:
- carrying out a functional test, or
- carrying out an analog test with digital output.

17. The method of claim 13, further comprising at least one of:
- holding a state of the electronic circuit unchanged depending on the comparison, or
- supplying a clock signal to the electronic circuit and stopping the clock signal to the electronic circuit depending on the comparison.

18. An electronic element comprising:
- means for receiving a scan test signal sequence to test storing components of the electronic circuit, the storing components coupled in series to form scan chains;
- means for providing actual value signals of a 3-value logic of the electronic circuit in response to the scan test signal sequence which is shifted through the scan chains;
- means for receiving desired value signals of the 3-value logic, wherein one of the logic levels of the 3-value logic is formed as a masking logic level to mask undefined states of the actual value signals that occur in the comparator circuit;
- means for comparing the actual value signals with the desired value signals; and
- means for providing the comparison.

19. The electronic element of claim 18, further comprising means for providing a masking signal based on one of the logic levels of the 3-value logic to mask undefined states of the actual value signals.

20. The electronic element of claim 19, further comprising means for holding a state of the electronic circuit unchanged depending on the comparison.

21. The electronic element of claim 20, further comprising:
- means for supplying a clock signal to the electronic circuit; and
- means for stopping the clock signal to the electronic circuit depending on the comparison.

* * * * *